United States Patent [19]

Hicks

[11] 4,383,286

[45] May 10, 1983

[54] COOLING AND POWER INPUT ASSEMBLY

[76] Inventor: Roy T. Hicks, 566 Irelan, Buellton, Calif. 93427

[21] Appl. No.: 367,009

[22] Filed: Apr. 9, 1982

[51] Int. Cl.³ .............................................. H05K 7/20
[52] U.S. Cl. ..................................... 361/384; 165/47; 361/357
[58] Field of Search ........................... 174/15 R, 16 R; 361/381, 383, 384, 393, 394, 356, 357; 165/80 B, 80 D, 122, 128, 129, 47; 200/153 G, 293, 294, 302, 306

[56] References Cited

U.S. PATENT DOCUMENTS

| | | | |
|---|---|---|---|
| 3,396,780 | 8/1968 | Koltuniak | 361/384 |
| 3,735,807 | 5/1973 | Hunt | 165/47 |
| 3,962,608 | 6/1976 | Forster | 361/384 |
| 4,027,206 | 5/1977 | Lee | 361/384 |
| 4,084,213 | 4/1978 | Kirchner | 361/384 |
| 4,084,250 | 4/1978 | Albertine | 361/384 |
| 4,126,269 | 11/1978 | Bruges | 381/384 |
| 4,237,521 | 12/1980 | Denker | 361/384 |

Primary Examiner—G. P. Tolin
Attorney, Agent, or Firm—Poms, Smith, Lande & Rose

[57] ABSTRACT

A cooling and electrical control assembly is provided for an electrical equipment such as a computer which is normally provided with venting slots for the dissipation of heat by the normal flow of ambient air. The ventilation slots on certain computers, such as an Apple Computer, are located on the upper sides of the housing for the computer, with the slots extending into the top panel of the electrical equipment and also down the sides thereof. The cooling and electrical control assembly disclosed in the present specification includes a housing having an open side, and protruding fingers for engaging the ventilation slots of the electrical equipment and for holding the housing into engagement with the side and top of the electrical equipment with the open side of the housing in sealing engagement with the ventilation openings. A fan is provided in the housing to exhaust air from the electrical equipment through the ventilation slots. An electrical switch and electrical power connections are provided so that the fan is turned on, and power supplied to the main electrical equipment when the switch is actuated. The housing may be merely set in place with the fingers extending down into the ventilation slots, and the weight of the housing holding it against the electrical equipment, so that no screws or other fasteners are required for installation.

11 Claims, 6 Drawing Figures

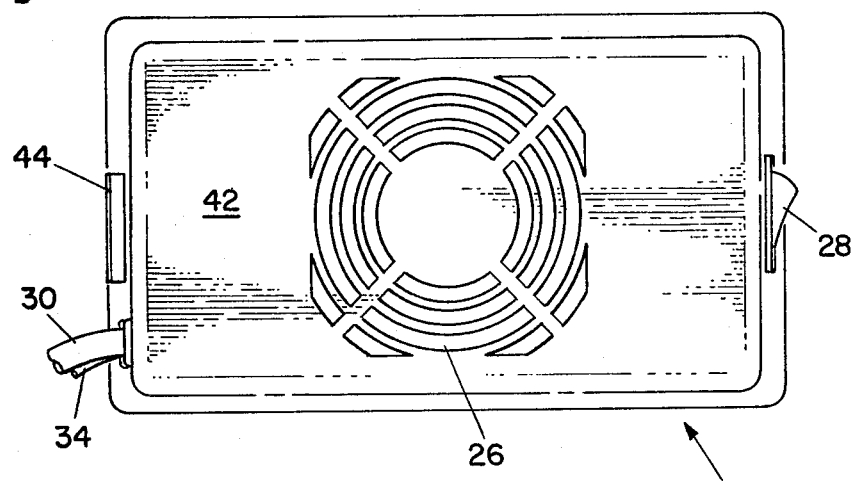
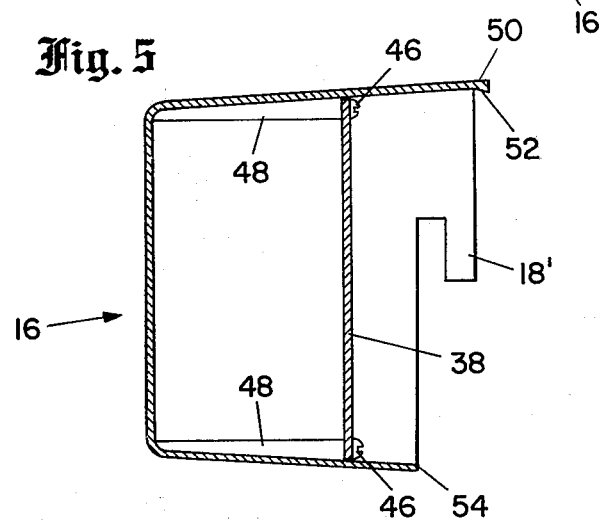
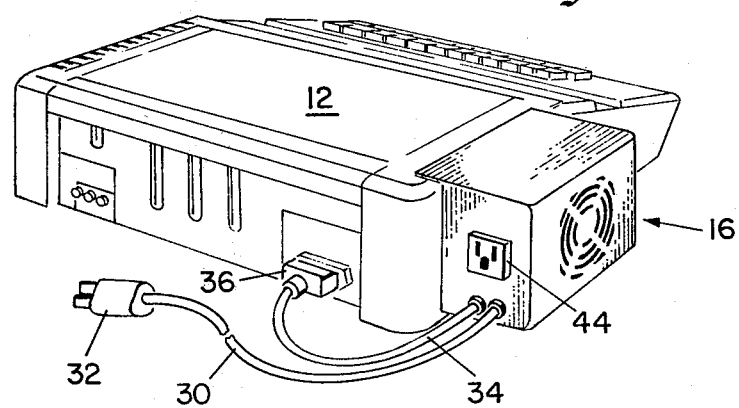

COOLING AND POWER INPUT ASSEMBLY

FIELD OF THE INVENTION

The present invention relates to cooling and electrical control arrangements for electrical equipment which might otherwise overheat.

BACKGROUND OF THE INVENTION

Certain types of electrical equipment such as data processing or computer equipment may operate satisfactorily and not overheat when the equipment is provided with ventilation slots or openings, whereby the normal convection flow of air is adequate to cool the computer. However, when certain auxilliary equipment is added to the computer such as supplemental storage or memory units, the equipment may overheat, and be subject to failure, unless additional cooling is provided. Although forced air cooling is known and is sometimes included within large electronic or electrical equipments, it is frequently not practical or possible to include a fan unit within the original confines of the electrical equipment casing. Accordingly, in such cases, the equipment may operate marginally at the higher ambient temperature, but may be subject to a higher rate of component failure, and the resultant failures of power switches, electronic chips or other components may cause considerable downtime, annoyance, and expense, to the owner of the equipment.

Accordingly an important object of the present invention is to provide supplemental cooling arrangements for an electrical or electronic equipment of the type described hereinabove, while concurrently insuring that the main electrical equipment is not operated unless the supplemental cooling arrangements are energized.

SUMMARY OF THE INVENTION

In accordance an overall aspect of with the present invention, a combined cooling and electrical control assembly for an electrical equipment having ventilation slots or openings includes a housing which is open on one side and which has fingers or hooks which fit into the ventilation openings or slots in the main electrical equipment so that the open side of the housing fits tightly over the ventilation slots or openings; and the housing includes a fan for exhausting air through the ventilation slots and through the housing. The assembly may also include a switch, and electrical wiring for supplying power both to the fan and to the main electrical equipment, so that when the switch is actuated the fan is turned on, and power is also supplied to the main electrical equipment.

In accordance with an additional feature of the invention, the housing is designed to fit over ventilation slots which extend up the side of the main electrical equipment and into the top surface thereof. To accommodate this configuration, the housing is of generally rectangular configuration, and on its inner or open side, a lip is provided which extends over the upper surface of the main equipment to avoid the leakage of air from the upper portions of the ventilation slots; and the fingers for securing the unit in place are formed from the sidewalls of the rectangular housing and extend downwardly over the lower edge of the ventilation slots in the main equipment to hold the housing firmly against the main equipment and fully cover the ventilation slots.

The electrical connections may include a main power cord extending to the housing, and a small short length cord for connecting to the main electrical equipment, with both the fan and the main electrical equipment being energized when the switch on the housing is turned on.

Advantages of the present invention include the fact that no screws or special fasteners are needed for installation, and the fact that the computer cannot be operated until the fan is turned on. An extra electrical plug is also provided on the housing to permit the energization of peripheral equipment such as a video monitor which is frequently employed in combination with the computer. It is also noted that, with the arrangement as described above, the open portion of the housing constitutes a low pressure plenum which draws air from all of the ventilation slots included between the two end slots into which the retaining fingers are mounted.

The housing for the assembly is preferably of general rectangular configuration and is formed as a high strength plactic injection moulding.

Other objects, features and advantages of the invention will be apparent from a consideration of the following detailed description and from the accompanying drawings.

BRIEF DESCRIPTION OF THE DRAWINGS

FIG. 4 is a showing of the housing illustrating the principles of the present invention the closed side thereof, showing the fan grille;

FIG. 5 is a cross-sectional view of the housing taken along lines V—V of FIG. 3; and FIG. 6 shows the power electrical connections for the housing and for the computer electronic equipment.

DETAILED DESCRIPTION

Figure 1:
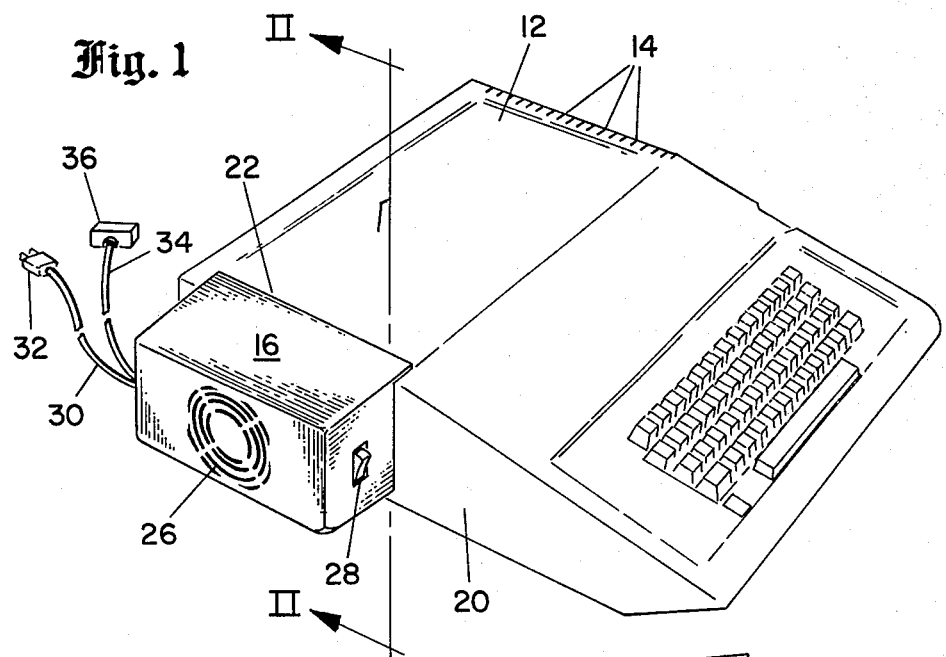
FIG. 1 is a showing of the assembly illustrating the present invention, mounted on a widely used commercially available personal computer.

Referring more particularly to the drawings, FIG. 1 shows an electronic equipment 12 which might, for example, be a home computer such as the Apple Computer. Along the upper rear side edges of the computer 12, on both sides, are a series of ventilation slots 14, which extend about 1½, or 1 7/16ths inch down the sides of the computer, and extend about ⅝ths of an inch deep, into the top panel of the computer. There happen to be 18 slots in the side of the Apple Computer and they are each in the order of ⅛th inch wide.

Figure 2:
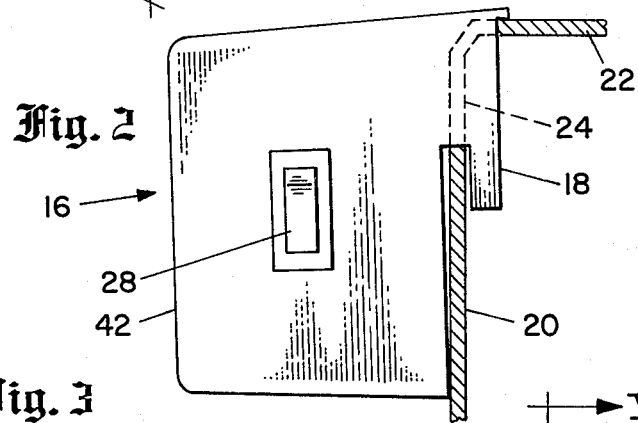
FIG. 2 is an end view of the housing a partial cross-sectional view of the main electronic equipment on which it is mounted, taken along lines II—II in FIG. 1.

The ventilation and power control assembly 16 is mounted on the left side of the computer 12, toward the rear thereof, and has two fingers 18 (as best shown in FIG. 2) extending into the two end ventilation slots on the upper left-hand rear portion of the housing of the computer 12. For convenience, the left side panel of the computer 12 is designated by the reference numeral 20, and the top panel by the reference numeral 22. As shown in FIG. 2, the finger 18 extends into the slot 24 in the panels 20 and 22.

A grille 26 is provided in the housing 16, and a fan located within housing 16 exhausts air from within the equipment 12 through the ventilation slots and out through the grille 26. Also shown in FIG. 1 and in FIG.

2 is the "on/off" switch 28 which both turns the fan within housing 16 on and off, and also supplies power to the computer 12. Connected to the back of the housing 16 are the input power cord 30 with its three terminal connector plug 32; and a short electrical power cord 34 to the plug 36 which fits the electrical receptacle in the back of the computer 12. The electrical switch 28 both turns on the fan within the housing 16 to exhaust air from the computer 12, and also supplies power through cable 34 to the computer 12.

Figure 3:
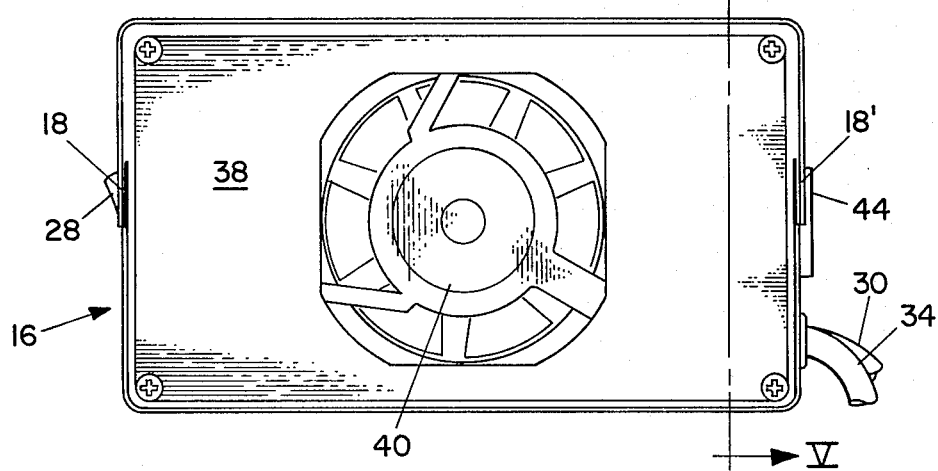
FIG. 3 is a view of the housing taken of the present invention the open side thereof.

FIGS. 3 and 4 are views from the inside or the open side of the housing 16, and from the outside thereof, respectively. Visible in FIG. 3 are the two fingers or hooks 18 and 18° which hold the housing in position on the computer, and an inner panel 38 which provides additional strength, and which also helps to hold the fan 40 firmly in place within the housing 16 and without vibration. The fan assembly 40 includes an peripheral duct and a series of fan blades for exhausting air through the grille 26. The fan housing is secured in place through the use of heat deformable studs which protrude inwardly from the closed side 42 of the housing 16.

An additional plug 44 may be provided to supply power to peripheral equipment which may be associated with the computer 12. The plug 44 is preferably connected to be powered when the switch 28 is turned on, so that the peripheral equipment is not inadvertently left on.

FIG. 5 is a cross-sectional view taken along lines V—V of FIG. 3. As shown in FIG. 5, the supplemental panel 38 is secured in place by four screws 46 which pass through holes in the corners of the plate 38, and extend into strengthening ridges 48 located in the corners of the housing 16. The upper wall of the housing 16 extends to the right as shown in FIG. 5 with the lip 50 extending beyond the finger 18°. In addition, the lip 50 has a slightly downwardly directed surface 52 which engages the upper panel 22 of the computer 12 beyond the inner extent of the slots, to help seal the ventilation slots and avoid undue bypassing of air which is being exhausted by the fan 40. It may also be noted that the weight of the housing 16 and the fan and other electrical components inside it, will hold the inner edge 54 of the bottom of the housing 16 against the left-hand sidewall of the computer 12, as shown in FIG. 1, so as to further complete the closure of the housing 16 above and below the ventilation slots.

The simplicity of the mounting arrangements for the housing 16 is again emphasized, with the only securing arrangements being the two fingers 18 and 18°, together with the weight of the housing holding it firmly in place, both at the surface 52 of lip 50 and also at the edge 54 of the lower surface of the housing. No screws or other fasteners are required to hold the unit in place.

FIG. 6 is a schematic showing, indicating the power connections at the rear of the unit 16 and the computer 12. As shown in FIG. 6, the short cord 34 is provided with plug 36 which plugs into the computer 12. Accordingly, when plug 32 is connected to the input power line, the switch 28 will not only turn the fan 40 on, but will also power the equipment 12. This precludes the possibility that the equipment 12 could be energized without the fan being turned on, and thus positively prevents overheating failure of the equipment 12.

By way of completeness, it is noted that the overall dimensions of the supplemental cooling and electrical control housing are approximately 6⅝ths inches long by approximately 3⅜ths inches high by approximately 3⅞ths inch deep. The housing 16 and the plate 38 are made of high strength plastic approximately 1/16th inch thick. The housing is generally rectangular, but is provided with suitable tapering or draft angles to facilitate the injection moulding process. The fan motor is a relatively slow speed motor with a sleeve-type bearing to keep the fan noise level to a minimum. The fingers 18 and 18° are approximately ⅝ths inch long and 5/16ths inch wide. The lip 50 extends outwardly approximately 3/32nds of an inch beyond the fingers 18 and 18°. It is to be understood that the foregoing dimensions are merely indicative of the presently preferred embodiment, and in no way are to be considered limiting.

In closing, it is to be understood that the arrangements described hereinabove and shown in the accompanying drawing, are merely illustrative of the principles of the invention. Other arrangements are within the scope of the present invention. Thus, by way of example and not of limitation, the housing could be employed with ventilation slots or openings which are only on the side or only on the top of the principal equipment or computer, with the fingers or other securing means engaging these recesses to hold the housing in place over the ventilation openings or slots. Also, more than one supplemental output plug 44 may be provided, and a cooling function may be included without the supplemental control of the power to the computer. Accordingly, it is understood that the present invention is not limited to that precisely as shown and described hereinabove.

What is claimed is:

1. A cooling assembly for an electrical equipment having a series of ventilation openings comprising:
   a housing open on one side and having a fan outlet grille on the opposite side thereof, said housing having front and rear sides, and a top and bottom;
   fan means mounted in said housing for exhausting air from the electrical equipment through the ventilation openings;
   means for channelling air drawn from the ventilation openings into the open side of said housing to said fan means and toward said outlet grille,
   said means including a panel extending substantially vertically between said top and bottom and the front and rear sides of said housing, said panel having a substantially centrally located opening, and said panel being spaced back from the open side of said housing, on the other side of said fan means from said outlet grille;
   means for holding said assembly in place with the open side of said housing against said electrical equipment for drawing air from the ventilation slots, said holding means including:
   finger means extending outwardly from the open side of said assembly substantially perpendicular to said housing, and said finger means having downwardly extending hook means for extending inside the electrical equipment and for holding said housing in against the electrical equipment;
   electrical wiring means for supplying power to said fan and to the electrical equipment, connected to said housing; and
   switch means mounted on said housing for turning on said fan and simultaneously supplying power to the electrical equipment.

2. An assembly as defined in claim 1 wherein said fingers are in the form of downwardly directed hooks formed on the sides of said housing, adjacent the open side of said housing.

3. An assembly as defined in claim 1 wherein said housing is a plastic injection moulding.

4. An assembly as defined in claim 1 wherein said housing has upper lip means, formed as an extension of the top of said housing, for extending over and engaging the upper surface of said electrical equipment beyond said ventilation slots to assist in the sealing of said open side of said housing around said ventilation slots.

5. A cooling assembly for an electrical equipment having a series of thin vertically extending ventilation slots at an upper corner of the electrical equipment, comprising:
- a housing open on one side and having a fan outlet grille on the opposite side thereof, said housing having front and rear sides, and a top and bottom;
- fan means mounted in said housing for exhausting air from the electrical equipment through the ventilation slots;
- means for channelling air drawn from the ventilation slots into the open side of said housing to said fan means and toward said outlet grille,
- said means including a panel extending substantially vertically between said top and bottom and the front and rear sides of said housing, said panel having a substantially centrally located opening, and said panel being spaced back from the open side of said housing, on the other side of said fan means from said grille;
- means for holding said assembly in place with the open side of said housing against said electrical equipment for drawing air from the ventilation slots, said holding means consisting solely of:
  (1) lip means, formed as an extension of the top of said housing, for extending over and for engaging the upper surface of said electrical equipment beyond said ventilation openings, for substantially the full length of the open side of said housing to assist in the sealing of said open side of said housing around the ventilation openings; and
  (2) finger means extending outwardly from the open side of said assembly substantially perpendicular to said housing and substantially vertically, said fingers being thin and flat for extending into the ventilation slots, and said fingers having downwardly extending hook means for holding said housing in against said electrical equipment; and
- said housing being adapted for securing onto electrical equipment with its edges substantially sealing around the ventilation openings only by said fingers, said upper lip means and the weight of said housing, whereby said housing may be installed by merely setting it in place without the use of any screws, tools or the like.

6. An assembly as defined in claim 5 wherein said fingers are in the form of downwardly directed hooks formed on the sides of said housing.

7. An assembly as defined in claim 5 wherein said housing is a plastic injection moulding.

8. A cooling assembly for an electrical equipment having a series of ventilation openings comprising:
- a housing open on one side and having a fan outlet grille on the opposite side thereof, said housing having front and rear sides, and a top and bottom;
- fan means mounted in said housing for exhausting air from the electrical equipment through the ventilation openings;
- means for channelling air drawn from the ventilation openings into the open side of said housing to said fan means and toward said outlet grille,
- said means including a panel extending substantially vertically between said top and bottom and the front and rear sides of said housing, said panel having a substantially centrally located opening, and said panel being spaced back from the open side of said housing, on the other side of said fan means from said outlet grille; and
- means for holding said assembly in place with the open side of said housing against the electrical equipment for drawing air from the ventilation slots, said holding means including:
- finger means extending outwardly from the open side of said assembly substantially perpendicular to said housing, and said means having downwardly extending hook means for extending inside the electrical equipment and for holding said housing in against the electrical equipment.

9. An assembly as defined in claim 8 wherein said housing is a high strength plastic injection moulding.

10. A cooling assembly for an electrical equipment having a series of ventilation openings comprising:
- a housing open on one side and having a fan outlet grille on the opposite side thereof, said housing having front and rear sides, and a top and bottom;
- means including a fan mounted in said housing for exhausting air from the electrical equipment through the ventilation openings, into said housing and out through said fan outlet grille;
- means for holding said assembly in place with the open side of said housing against said electrical equipment for drawing air from the ventilation slots, said holding means including finger means extending outwardly from the open side of said assembly, and said finger means having downwardly extending hook means for extending inside the electrical equipment and for holding said housing in against the electrical equipment with the edges of said housing around said open side of said housing making engagement with the electrical equipment;
- electrical wiring means for supplying power to said fan and to the electrical equipment, connected to said housing; and
- switch means mounted on said housing for turning on said fan and simultaneously supplying power to the electrical equipment.

11. A cooling assembly for an electrical equipment having a series of ventilation openings comprising:
- a housing open on one side and having a fan outlet grille on the opposite side thereof, said housing having front and rear sides, and a top and bottom;
- fan means mounted in said housing for exhausting air from the electrical equipment through the ventilation openings;
- means for channelling air drawn from the ventilation openings into the open side of said housing to said fan means and toward said outlet grille, and
- means for holding said assembly in place with the open side of said housing against the electrical equipment for drawing air from the ventilation slots, said holding means including finger means extending outwardly from the open side of said assembly, and said means having downwardly extending hook means for extending inside the electrical equipment and for holding said housing in against the electrical equipment, with the edges around the open side of the housing in engagement with the electrical equipment.

* * * * *